United States Patent [19]

Elbert et al.

[11] Patent Number: 4,871,965
[45] Date of Patent: Oct. 3, 1989

[54] ENVIRONMENTAL TESTING FACILITY FOR ELECTRONIC COMPONENTS

[75] Inventors: Hubert F. Elbert, Tuscon; Gary March-Force, Benson, both of Ariz.

[73] Assignee: Apex Microtechnology Corporation, Tucson, Ariz.

[21] Appl. No.: 235,751

[22] Filed: Aug. 18, 1988

Related U.S. Application Data

[63] Continuation of Ser. No. 27,116, Mar. 16, 1987, abandoned, which is a continuation of Ser. No. 820,029, Jan. 21, 1986, abandoned.

[51] Int. Cl.⁴ .......................... G01R 1/02; G01R 1/04
[52] U.S. Cl. ......................... 324/158 F; 324/73 AT; 324/158 P
[58] Field of Search .......... 324/73 PC, 23 AT, 158 P, 324/158 F, 158 D; 374/45, 46; 73/432 SD

[56] References Cited

U.S. PATENT DOCUMENTS

| 2,773,731 | 11/1952 | Chick et al. | 324/158 F |
| 3,807,216 | 4/1974 | Lindwedel et al. | 73/432 SD |
| 4,532,423 | 7/1985 | Tojo et al. | 324/158 F |
| 4,604,572 | 8/1986 | Horiuchi et al. | 324/158 F |

FOREIGN PATENT DOCUMENTS

| 0426166 | 4/1974 | U.S.S.R. | 374/45 |
| 0522461 | 7/1976 | U.S.S.R. | 73/432 SD |
| 0583413 | 12/1977 | U.S.S.R. | 324/158 F |
| 0673943 | 7/1979 | U.S.S.R. | 324/158 F |

OTHER PUBLICATIONS

"Fiber Optic Sensor for Testing and Sorting Semiconductor Devices", by Beldring et al., Western Electric Tech Dig., 1/74, #33, pp. 11-12.

*Primary Examiner*—Reinhard J. Eisenzopf
*Assistant Examiner*—W. Burns
*Attorney, Agent, or Firm*—William W. Holloway

[57] ABSTRACT

An environmental testing facility for verifying operational conditions of electronic components at predefined temperature extremes is described. A removable multistation holder is configured to have a plurality of components coupled thereto. The multistation holder is coupled to a controllable, rotatable shaft. A hood is placed over the holder, shaft and associated apparatus and placed in contact with a base plate, so that a vacuum can be established in the resulting chamber. A sensing device permits the positioning of the individual components with respect to an interface apparatus. When the component is correctly positioned with respect to the interface apparatus, the interface apparatus is moved to engage the terminals of the components. The electrical signals can be applied to and received from the component through the interface device. After a first temperature condition is established for the multistation holder and consequently for the components coupled thereto, all of the components are tested. Thereafter, the components are tested at the second temperature condition. The testing apparatus is operated under control of data processing circuits that can apply and receive signals from the components for operation evaluation and can automatically position the components with respect to the interface apparatus, and can provide appropriate signals for a sequence of the testing procedure.

16 Claims, 2 Drawing Sheets

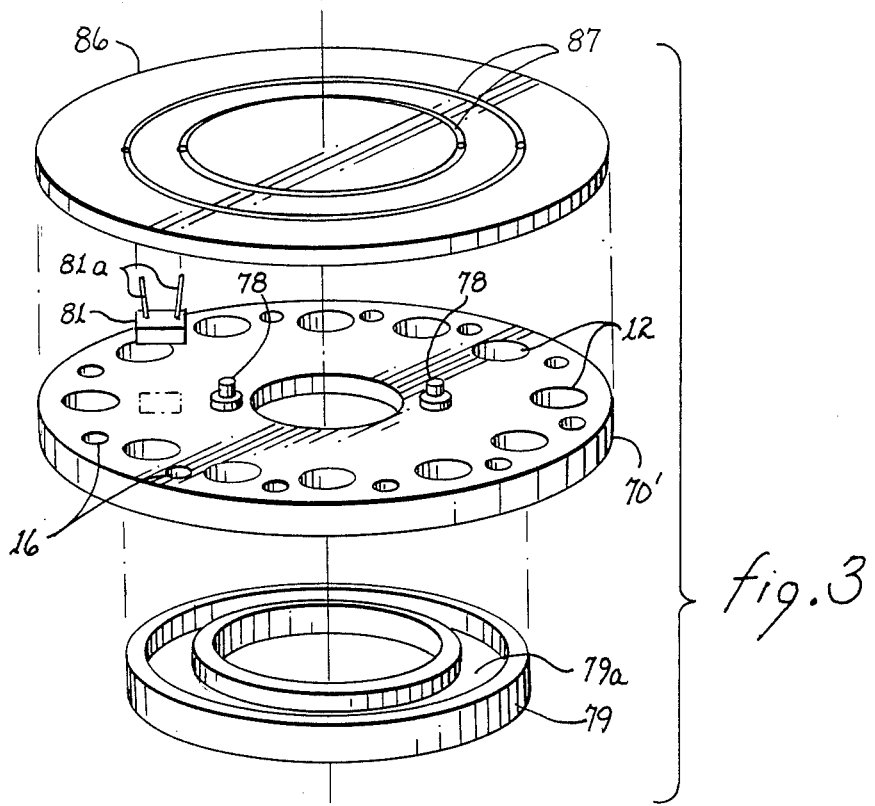
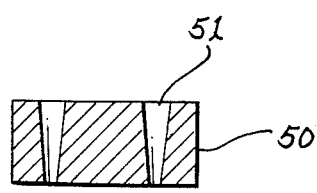
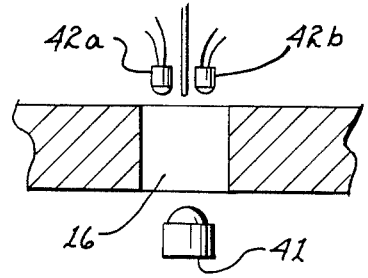

ENVIRONMENTAL TESTING FACILITY FOR ELECTRONIC COMPONENTS

This is a continuation of co-pending application Serial No. 07/027,116 filed on Mar. 6, 1987 which was a continuation of application Ser. No. 820,029 filed Jan. 21, 1986, now abandoned.

BACKGROUND OF THE INVENTION

1. Field of the Invention

This invention relates generally to electronic components and, more particularly, to a facility for testing the electronic components under severe environmental conditions.

2. Description of the Related Art

A wide variety of applications for electronic components exists in which the components will be subjected to extreme ambient environmental conditions. Under these extreme environmental conditions, there is a greater likelihood of either unacceptable deterioration of performance or failure of the component. An important example is the use of electronic components for military applications in which extremes of environment can be anticipated. To minimize the impact of adverse environmental conditions, the performance parameters of the electronic components can be specified over a wide range of ambient temperature conditions. In order to insure that the components perform at these extreme environmental conditions, it is necessary to verify the component characteristics under the conditions of maximum environmental severity. Having tested the operational characteristics of a component under the severest expected conditions, this component can safely be designed into circuits without risk that the required characteristics will not be met under anticipated environmental conditions.

In the past, the testing of electronic components under these simulated conditions have typically been accomplished by attaching the electronic component to a suitable experimental testing circuit and cycling the component through the severest conditions. The components are then tested under those severest conditions to determine whether the performance parameters meet the predetermined requirement for the components. This testing procedure suffers from the necessity of placing a new component in the testing circuit at the end of each testing cycle and to recycle the environment of the new component. Such a procedure clearly does not lend itself to automated testing or to the testing of large numbers of components. To expedite speed the process and to render the process more susceptible to automation, a plurality of components and therefore a plurality of testing circuits can be exposed to the severe environmental conditions simultaneously. This testing procedure suffers from the requirement for a plurality of testing circuits to test the electronic components. In addition, when the testing requirements are altered, a multiplicity of new testing circuit configurations must be implemented. Furthermore, the test circuits themselves can be subjected to the severe environment condition. Finally, putting a large number of units to be tested into an environmental chamber using wire connections to a test apparatus precludes many dynamic tests due to the reactances in the long coupling wire.

A need has therefore been felt for an environmental testing facility for electronic components that can cycle a multiplicity of electronic components through severe environmental conditions and yet be suitable for automated execution of the testing procedures.

SUMMARY OF THE INVENTION

It is therefore an object of the present invention to provide an improved environmental testing apparatus for electronic components.

It is another object of the present invention to provide an environmental testing facility for electronic components that can be automated.

It is yet another object of the present invention to permit the testing of electronic components with a minimum number of electrical test circuits.

It is still another object of the present invention to provide apparatus for testing electronic components in which the test circuits are not exposed to the extremes of the test environment.

It is a more particular object of the present invention to provide a plurality of stations for placement of electronic components to be tested, i.e. units under test (or UUT).

It is yet another particular object of the present invention to provide a multi-unit testing facility in which all electronic components placed at all locations are brought into contact with the extreme conditions of environment at the same time.

It is a still further object of the present invention to test a plurality of electronic components under one extreme environmental condition and then test the plurality of electronic components under a different extreme environmental condition.

It is still a further particular object of the present invention to provide for the testing of a plurality of components under extreme environmental conditions of heat and cold that does not require intervention from an operator.

It is yet another object to couple the electronic units to be tested directly into the test circuits without requiring lengthy electrical conductors for full dynamic testing.

The aforementioned and other objects are accomplished, according to the present invention, by a base plate and cover forming a vacuum chamber, a removable multistation holder for holding a plurality of components, apparatus for moving the multistation holder so that a selected component can be located at a predetermined position, interface apparatus for electrically engaging the component currently occupying the predetermined position, the interface apparatus including circuitry for exchanging signals between the component at the predetermined position and a testing apparatus, transport apparatus for mechanically moving the interface apparatus relative to the multistation holder, and a thermal control apparatus for cooling and heating the multistation holder to predetermined temperatures. The multistation holder is an annular ring including structure to which the electron components to be tested can be coupled. The multistation holder is moved to position the selected electronic component in the vicinity of the interface apparatus and the transport apparatus mechanically couples electric terminals of the interface apparatus with electrical terminals of the component for exchange of electrical signals. The thermal control apparatus provides and maintains the desired environmental temperatures. The interface circuitry can be automatically coupled to the components as part of the test procedure, and the electronic component subjected to a preestablished test sequence involving the exchange of electrical signals. At the completion of the test sequence, the tested component can be detached from the interface apparatus and the multistation holder can be moved until the next component to be coupled to the interface apparatus is in the desired spatial relationship to the interface apparatus. To further expedite the testing of the components, the multistation holder can be replaceable on the positioning apparatus so that, while a first group of components is being tested, a second group of components can be coupled to a duplicate annular ring.

These and other features will be understood upon reading of the following description along with the Figures.

BRIEF DESCRIPTION OF THE DRAWINGS

FIG. 3 is an exploded view of an embodiment of the multistation holder of the present invention.

FIG. 4 is a cross-sectional view of a holder for facilitating coupling of the interface apparatus and the electronic component.

FIG. 5 is an enlarged view showing in detail the operation of multistation holder positioning apparatus of the present invention.

DESCRIPTION OF THE PREFERRED EMBODIMENT

Detailed Description of the Figures

Figure 1:
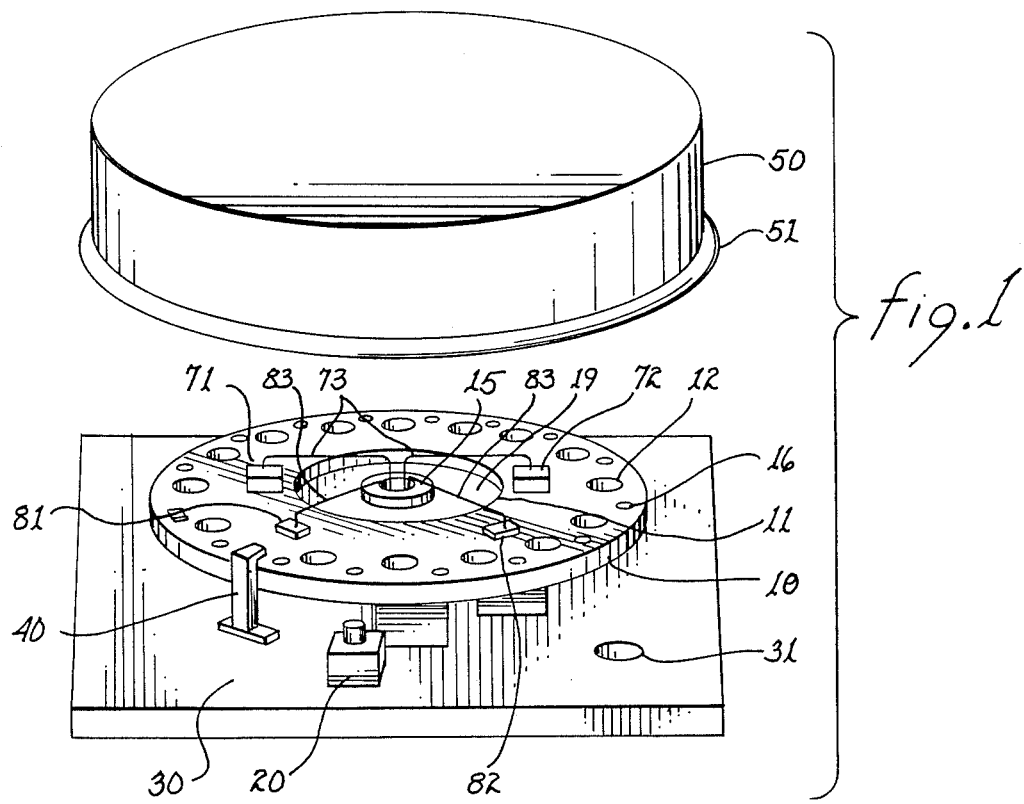
FIG. 1 is a perspective front view of the environmental testing facility of the present invention.

Referring now to FIG. 1, a base plate 30 provides the support for components of the environmental testing facility and forms one enclosing surface of a vacuum chamber. Hood 50 can be raised and lowered, by apparatus not shown, to engage the base plate 30 and provides the remaining enclosing surfaces of the vacuum chamber. A ring 51 of flexible material can be provided on the edge of hood 50 in proximity with base plate 30 to provide a seal permitting evacuation of the chamber formed by the base plate 30 and the hood 50. A multistation holder 10, in the shape of an annular ring, is mounted on a metallic circular plate 11. Circular plate 11 is coupled to a teflon ring 10. The teflon ring 19 provides for thermal isolation between the multistation holder 10 and circular plate 11 and the shaft 15 supporting the ring. Multistation holder 10 can be easily coupled and decoupled to circular ring 11 by means of bolts or similar apparatus. Interface apparatus 20 is positioned in a predetermined location on the base plate 30. A plurality of apertures 12 are arranged to permit removable mounting of components 5 in the apertures 12. The mounting of components 5 provides a good thermal contact with the multistation holder 10. The components 5 can be coupled to the multistation holder 10 by screws or the like. When the apertures to which components have been coupled are appropriately placed with respect to interface apparatus 20, the interface apparatus 20 can be moved upward to engage the electrical contacts of the component. The base plate 30 includes an aperture 31 to which a vacuum system 34 (of which only a portion is shown) can be coupled and the chamber can be evacuated. Apparatus is provided for moving the interface apparatus 20 and for rotating the shaft 15 so that coupling of the testing apparatus can be made between the testing apparatus and the component. Solenoid device 36 is used to extend and retract the interface apparatus 20 and when a component 5 is appropriately positioned, the interface apparatus 20 can engage the terminals of the component when the interface apparatus is extended. Solenoid device 36 that extends and retracts interface apparatus 20 and the motor 90 (and associated gears 91 and 92) that rotates the center shaft 15 (and therefore the multistation holder 10) are located beneath the base plate 30 and outside of the vacuum chamber. Both the center shaft 15 and the interface apparatus 20 have a vacuum seal between the components and the base plate to permit maintenance of a vacuum when the hood 50 and seal 51 are in contact with the base plate 30. A radiation source 41 and radiation detector 42 are positioned on mount 40. A plurality of apertures 16 are provided in the annular ring each having a predetermined position with respect to apertures 12 into which components to be tested are mounted. The radiation source 41 and radiation detector 42 are used to position apertures 12 of the multistation holder 10 with respect to testing apparatus 20 by determining when radiation is transmitted through an aperture 16 associated with a selected component 5. The multistation holder 10 can be rotated until aperture 16 indicates that aperture 12 (and the component coupled therein) are positioned to engage interface apparatus 20 when apparatus 20 is elevated with respect to base plate 30. From the center of hollow shaft 15, a plurality of pipes 73 extend to gas-coupling devices 71 and 72. The gas coupling devices, 71 and 72, ar in turn coupled to a channel 74 in circular ring 11, circular ring 11 coupling the center shaft 15 and teflon ring 19 to multistation holder 10. At least one of the gas coupling devices can include a valve for controlling a flow of gas through the channel in ring 11. Mounted on multistation holder 10 and in good thermal contact therewith are a plurality of heating elements 81. Also mounted on multistation holder 10 are a plurality of temperature measuring devices 82. Electrical leads 83 extending through the shaft 15 electrically couple the heating apparatus and the temperature sensing apparatus to control the apparatus. Similarly, the cooling gas conduits 73 and electrical leads 83 pass through shaft 15 and through seals that maintain the vacuum within the chamber formed by base plate 30 and hood 50.

Figure 2:
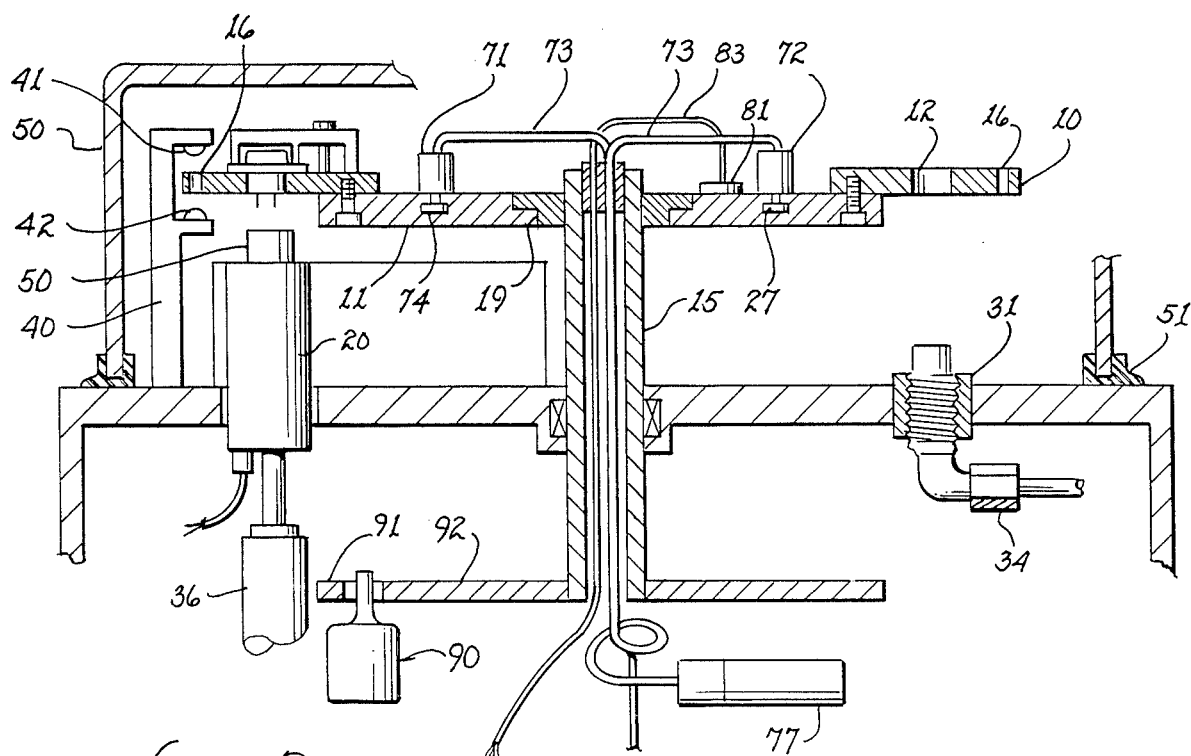
FIG. 2 is a cross-sectional view of the environmental testing facility of the present invention.

Referring now to FIG. 2, a cross-sectional view of the environment testing apparatus is shown. Annular ring 10 has an apertures 12 for mounting a component 5 to be tested. Mount 40 supports radiation source 41 and radiation detector 42 as well as electrical leads associated therewith (not shown). When aperture 16 is in an appropriate position with respect to mount 40 and the associated apparatus, then a radiation from the radiation source 41 can be detected by radiation detector 42. When aperture 16 is in this position, the associated component 5 is positioned with respect to interface apparatus 20. Solenoid device 36 can elevate the interface apparatus 20 in response to appropriate control signals. The solenoid device 36 and interface device 20 are coupled to the base plate 30 in such a manner so as to maintain the vacuum created between base plate 30 and the hood 50. Similarly, shaft 15 is constructed with appropriate seals to rotate with respect to base plate 30 while still maintaining the vacuum created between base plate 30 and hood 50. The shaft 15 is coupled to teflon ring 19 and subsequently to circular plate 11 and annular ring 10, all being rotated by motor 90. Motor 90 drives motor gear 91 which in turn engages and drives shaft gear 92. Thus, motor 90 controls the rotation of the annular ring multistation holder 10. Heating elements 81 are coupled with good thermal contact to circular ring 11. Heating element 81 is coupled to leads 83 which provide for actuation of the heating element in response to control signals. Circular ring 11 is coupled to annular ring 10 so as to be in good thermal contact therewith. Gas from the container 77 can be introduced in channel 74 of circular member 11 through conduits 73 and coupling member 71. The gas can be removed from the channel 74 by conduit 73 and coupling member 72.

Referring next to FIG. 3, an improved implementation of the multistation holder 10 is shown. The new multistation holder 10' includes the multistation holder 10 and the circular ring 11 of the previously described implementation. Multistation holder 10' can be coupled directly to teflon ring 19. The gas channel 74 is created in the new implementation by an annular ring 79 with a circular hollowed portion 79a. When annular ring 79 is coupled to multistation holder 10', the hollowed portion 79a forms the equivalent of channel 74 of the previous implementation. Gas is introduced into and extracted from channel 79a through quick-release gas valves 78. The quick release valves 78 are readily attached to and detached from gas conduits 73. The gas conduits 73 can be de-coupled when the multistation holder 10' is removed for replacement of tested components. Associated with multistation holder 10', an insulating ring 86 has two conducting paths 87. A heating element 81 is positioned under the insulating ring 86 with the terminals 81a coupled to the conducting paths 87. The conducting paths 87 have an apparatus (not shown) for electrically coupling the conducting paths to and de-coupling the conducting paths from leads 83 with multistation holder 10' to be removed from teflon ring 19.

Referring to FIG. 4, a guide 50 is shown for guiding component terminals into the associated terminals of the interface apparatus 20. The guide 50 is positioned on the upper portion of interface apparatus. The apertures 51, though which the component terminals pass, have walls that are beveled so that if the multistation holder is slightly misaligned, or if the component terminals are slightly bent, the terminals will be guided into the terminal coupling apparatus of the interface device 20.

Referring to FIG. 5, a detailed diagram of the apparatus for positioning the multistation holder 10 is shown. Radiation source 41 is positioned on one side of multistation holder 10, while the radiation detectors 42a and 42b are positioned on the opposite side of the multistation holder. When radiation from radiation source 41 passes through aperture 16, the radiation will be detected by one or both of the radiation detectors. When the aperture 16 is correctly positioned, approximately equal intensity of radiation will be detected by each detector. Control apparatus can determine when the signal from the radiation detectors is equal, and in the case of an imbalance of detector signals, can activate the motor 90 to correct the position of aperture 16.

Operation of the Preferred Embodiment

Referring once again to FIG. 1, a plurality of components 5 can be loaded into the apertures 12 of the multistation holder 10 (or 10'). Multistation holder 10 is coupled to the shaft 15 by means of circular ring 11 and teflon coupling ring 19. Hood 50 with sealing ring 51 is lowered onto the base plate 30 forming a chamber between these elements. The vacuum apparatus 34 is then activated and the air within the chamber is evacuated. The purpose of the vacuum is to minimize thermal transfer via convection of the atmosphere. Therefore, the vacuum requirements are modest, approximately 1 Torr pressure in the chamber is sufficient to eliminate most of the convective heat transfer. An aperture 12 with a component 5 is positioned over the interface apparatus 20. The activation of the solenoid mechanism 21, associated with interface apparatus 20, permits the coupling of the component 5 with the test apparatus 20. The interface apparatus 20 is moved into place and the socket, attached to the interface apparatus 20, has engaged the component terminals. The heating or cooling element controlling the temperature of cooling plate 11 and therefore multistation holder 10 is adjusted to a preset condition. Cooling will be generally accomplished first to permit the less efficient cooling process to begin at a comparatively low temperature. The cooling is accomplished by expansion of a liquid to gas, e.g. $CO_2$, in the cavity 74 of circular ring 11. A supercooled liquid such as freon can also be used. One tub supplies the compressed material and the second tub provides the return of the expanded gaseous material. The interface apparatus 20, which is coupled to a control and test apparatus outside of the environmental chamber, then performs a series of tests to be performed on each component when the desired temperature has been reached. After the test sequence has been completed for all components at the coolest temperature, the extreme hot environmental condition can then be established for the multistate holder and the test sequence can be repeated for all the components of the annular ring for the new environmental condition. At this point the vacuum apparatus can be halted and the environmental condition producing apparatus is disabled. The hood 50 is then lifted from base 30 and the multistation holder 10 (or 10') can be removed and a second multistation holder with a different set of components can be coupled to the circular plate 11 (or to teflon ring 19). The new components coupled to the second multistation holder can thus be tested. It will be clear that the testing procedure for all the components can be performed without human intervention. The positioning, testing and the establishment of environmental conditions can all be performed automatically for the entire series of components attached to the ring. The high temperature environmental condition (i.e. $+125°$ C.) is established by heating the heating elements 81 until temperature sensing element 83 indicates that the desired conditions have been achieved. With respect to cooling of the components (to $-55°$ C.), the gas liquid is utilized. The control apparatus can monitor the temperature of the multistation holder and can use the temperature establishing elements to correct for any deviations from the desired temperature. Gas/liquid is conducted to chamber 74 where the liquid is introduced through a nozzle. The expansion of the carbon dioxide and the continuous flow of the gas liquid through the chamber 74 cools circular ring 11 and consequently multistation holder 10 or in the case of the embodiment of FIG. 3, the multistation holder can be cooled directly. To prevent the unacceptable twisting of the electrical and gas conduit leads, the annular ring is rotated in one direction 360° or until all the components coupled to the multistation holder have been tested in the low temperature environment. The multistation holder can then be returned to the starting position. Then tests in the high temperature environment with the multistation holder are rotated the same direction as cold until all components have been tested in high temperature environment. Although the elements for gas flow and for conducting electrical signals through the shaft 15 must flex, the range of flexibility is limited because of the forward and reverse operation of the shaft and associated multistation holder has limited rotation. The multistation holder is positioned with respect to the interface apparatus by moving the holder until radiation from an radiation source is detected by a radiation detection device through an aperture 16, aperture 16 having a pre-determined relationship with the component to be tested. The solenoid can then be actuated by bringing the interface device into contact with the leads from the component under test.

It will be clear that because only one component is tested at a time, the test program can be easily altered. Indeed, different test procedures can be applied to different components during one test sequence.

The foregoing description is included to illustrate the operation of a preferred embodiment and is not meant to limit the scope of the invention. The scope of the invention is to be limited only by the following claims. From the foregoing description, many variations will occur to those skilled in the art that would yet be encompassed by the spirit and scope of the invention.

What is claimed is:

1. An environmental testing facility for electronic components, said testing facility comprising:
    a chamber having gases evacuated therefrom;
    component holder means in said chamber for holding a plurality of electronic components;
    position means for automatically positioning each of said plurality of electronic components in said chamber when said gases are evacuated from said chamber;
    interface means for testing one of said plurality of electronic components, said interface means including coupling means for electrically coupling to said one of said electronic components in response to control signals when said one of said plurality of electronic components is in a preselected position; and
    temperature means for establishing a predetermined temperature condition on said component holder means when said gases are evacuated from said chamber.

2. An environmental testing facility for electronic components in the temperature range of 125° C. to −55° C. and beyond, said testing facility comprising:
    a chamber capable of sustaining a vacuum therein;
    component holder means located in said chamber for holding a plurality of electronic components;
    position means for positioning each of said plurality of electronic components in said chamber at a preselected location;
    interface means located proximate said preselected location and responsive to control signals, said interface means including testing apparatus and connection means for electrically coupling said testing apparatus to a one of said plurality of electronic components when said one electronic component is in said preselected position, said connection means moving to engage terminals of said one electronic component when said electronic component is in said preselected position, said testing apparatus applying signals to and receiving signals from said one electronic component, said testing apparatus for testing located within said chamber; and
    temperature means for establishing a predetermined temperature condition on said specimen component holder means, wherein said temperature means includes heating means for heating said component holder means, cooling means or cooling said component holder means and sensing means for measuring a temperature of said component holder means;
    wherein said testing apparatus is isolated from thermal conditions of said one electronic component by said evacuation of vacuum in said chamber.

3. The environmental testing facility of claim 2 further comprising control means for controlling said position means, said interface means and said control means; wherein said plurality of electronic components are automatically tested at a first temperature and tested at a second temperature without operator intervention.

4. The environmental testing facility of claim 2 wherein said testing apparatus applies a sequence of signals to each electronic component at said preselected position, said sequence of signals being determined by control signals.

5. A method for testing operating parameters of semiconductor electronic components in the temperature range of 125° C. to −55° C. and beyond, the method comprising the steps of:
    removably attaching a plurality of said electronic components to a component holder;
    evacuating a chamber containing said component holder;
    controlling and monitoring a temperature of said component holder, said controlling determined by control signals;
    positioning said one component proximate to an interface means;
    coupling said interface means to said one component by moving said interface means to couple to terminals of said one component; and
    automatically testing operating characteristics of said one component by electrical signals exchanged with said interface means at a plurality of preselected temperatures, wherein said interface means is enclosed in said chamber;
    wherein said automatically testing step includes applying a sequence of signals to said one component in response to control signals.

6. The method of testing electronic components of claim 5 wherein said coupling step includes moving a socket associated with said interface means to engage said one component terminals when said one component is in said preselected position.

7. The method of testing electronic components of claim 5 wherein all components coupled to said component holder are tested with a first temperature condition before testing with a second temperature condition, said controlling a temperature step including flowing a cooled fluid through said component holder to establish a below ambient temperature condition for said component holder.

8. A testing facility for automatically testing a electronic components at at least one predetermined temperature comprising:
    rotation means for producing a controllable rotation;
    component holding means detachably coupled to said rotating means, said holding means including means for coupling a plurality of said electronic components thereto;

interface means for coupling to each component when said component is in a predetermined location;

position means for determining when a component is in said predetermined position, wherein said position means includes a radiation source, a radiation detector and a plurality of apertures in said component holding means;

temperature means for heating and cooling said plurality of electronic components; and monitoring means for measuring a temperature of said components.

9. The testing facility of claim 8 wherein said interface means includes moving means for moving said interface means to engage terminals of a component at said predetermined location, wherein said interface means includes a socket for engaging said terminals.

10. The testing facility of claim 9 wherein said interface means includes means for guiding said component terminals.

11. The testing facility for automatically testing a plurality of semiconductor electronic components at at least one predetermined temperature in the range of 125° C. through −55° C. and beyond, the testing facility comprising:

rotation means for producing a controllable rotation;

component holder means coupled to said rotation means, said holding means including means for mechanically and thermally coupling a plurality of said electronic eomponents thereto;

interface means for coupling to one component when said one component is in a predetermined location, said interface means moving to engage terminals of said one component in response to a control signal;

position means for determining when a component is in said predetermined location;

temperature means for heating and cooling said component holding means;

monitoring means for measuring a temperature of said components holding means; and a chamber including evacuation means for applying a vacuum to said component holding means, said interface means, said position means and said rotation means;

wherein said position means includes a radiation source and a radiation detector for identifying apertures in said component holder means.

12. The testing facility of claim 11 further comprising control means responsive to signals from said monitor means and said position means for applying control signals to said interface means and to said rotation means.

13. The testing facility of claim 11 wherein said plurality of electronic components coupled to said component holder means are tested at a first predetermined temperature condition below ambient temperature, and then tested at a second predetermined temperature condition above ambient temperature.

14. The testing facility for automatically testing a plurality of semiconductor electronic components at at least one predetermined temperature in the range of 125° C. through −55° C. and beyond, the testing facility comprising:

rotation means for producing a controllable rotation;

component holder means coupled to said rotation means, said holding means including means for mechanically and thermally coupling a plurality of said electronic components thereto;

interface means for coupling to one component when said one component is in a predetermined location, said interface means moving to engage terminals of said one component in response to a control signal;

position means for determining when a component is in said predetermined location;

temperature means for heating and cooling said component holding means;

monitoring means for measuring a temperature of said components holding means; and a chamber including evacuation means for applying a vacuum to said component holding means, said interface means, said position means and said rotation means;

wherein said plurality of electronic components can have one of a plurality of preselected test programs applied thereto in response to control signals applied to said interface unit.

15. The testing facility of claim 12 wherein said control means receives signals from said interface means identifying testing results for said one component.

16. The testing facility for automatically testing a plurality of semiconductor electronic components at at least one predetermined temperature in the range of 125° C. through −55° C. and beyond, the testing facility comprising:

rotation means for producing a controllable rotation;

component holder means coupled to said rotation means, said holding means including means for mechanically and thermally coupling a plurality of said electronic components thereto;

interface means for coupling to one component when said one component is in a predetermined location, said interface means moving to engage terminals of said one component in response to a control signal;

position means for determining when a component is in said predetermined location;

temperature means for heating and cooling said component holding means;

monitoring means for measuring a temperature of said components holding means; and a chamber including evacuation means for applying a vacuum to said component holding means, said interface means, said position means and said rotation means;

wherein said temperature means includes electrical conduction means and fluid conduit means coupled to said component holding means, said conduction means and conduit means activated by apparatus outside of said chamber, said electrical conduction means for heating said component holder means, said conduit means for cooling said component holder means by flowing a cooled fluid through said conduit means.

* * * * *